(12) United States Patent
Takiar

(10) Patent No.: US 6,177,288 B1
(45) Date of Patent: Jan. 23, 2001

(54) METHOD OF MAKING INTEGRATED CIRCUIT PACKAGES

(75) Inventor: Hem P. Takiar, Fremont, CA (US)

(73) Assignee: National Semiconductor Corporation, Santa Clara, CA (US)

( * ) Notice: Under 35 U.S.C. 154(b), the term of this patent shall be extended for 0 days.

(21) Appl. No.: 09/309,723

(22) Filed: May 11, 1999

Related U.S. Application Data

(60) Provisional application No. 60/089,954, filed on Jun. 19, 1998.

(51) Int. Cl.[7] ............................. H01L 21/66; G01R 31/26
(52) U.S. Cl. ............................... 438/15; 438/14; 438/17; 438/110; 438/113; 438/460; 438/462
(58) Field of Search ................................... 438/14, 15, 17, 438/110, 113, 460, 462

Primary Examiner—John F. Niebling
Assistant Examiner—David A Zarneke
(74) Attorney, Agent, or Firm—Beyer Weaver & Thomas, LLP

(57) ABSTRACT

A method of producing and electrically testing a chip scale integrated circuit package includes the step of providing a panel having a plurality of chip scale packages assembled on the panel. Each of the chip scale packages are electrically isolated from one another by cutting any electrically conductive paths which electrically interconnect the chip scale packages to one another on the panel. The step of electrically isolating the chip scale packages is done without singulating the chip scale packages. The chip scale packages are then individually electrically tested while they remain physically connected to one another on the panel. After the chip scale packages are individually tested, the chip scale packages are singulated.

6 Claims, 4 Drawing Sheets

METHOD OF MAKING INTEGRATED CIRCUIT PACKAGES

This application claims the benefit of U.S. Provisional Application No. 60/089,954 filed on Jun. 19, 1998, the disclosure of which is incorporated herein by reference.

BACKGROUND OF THE INVENTION

The present invention relates generally to integrated circuit (IC) packages and more specifically to methods for producing and testing chip scale integrated circuit packages.

In the IC packaging industry, there is continuous pressure to reduce the cost of packaging ICs. To accomplish this, a wide variety of package designs and methods for electrically testing these designs have been developed. One of the currently used techniques for producing ICs is referred to as Chip Scale Packaging (CSP).

Chip scale packages are typically produced on panels that include a plurality of packages manufactured on a single panel. FIGS. 1A–1E illustrate the main processing steps used to manufacture typical chip scale packages.

Referring to FIG. 1A which illustrates an initial step in producing a plurality of chip scale packages 10, a panel 12 is provided which includes an array of electrical connecting patterns 14 used to produce chip scale packages 10. Each of the electrical connecting patterns 14 is associated with one of the chip scale packages 10 being produced. Each of the electrical connecting patterns includes a plurality of electrically conductive traces formed on and/or within panel 12. As shown in FIG. 1A, the electrical connecting patterns are typically electrically connected to one another by traces which extend between adjacent electrical connecting patterns. These traces that interconnect adjacent patterns will be cut to electrically isolate each of the patterns from one another in a later process step in which the panel is sawed into individual chip scale packages.

As illustrated in FIG. 1B, a plurality of integrated circuit die 16 are attached to the top surface of panel 12 using a suitable die attaching process. Each die 16 corresponds to an associated one of electrical connecting patterns 14 and is positioned above its associated pattern. Next, as shown in FIG. 1C, an array of bonding wires 18 is formed to electrically connect each die 16 to its associated electrical connecting pattern 14 (not shown in FIG. 1C). Typically, electrical connecting patterns 14 extend through panel 12 such that portions of the pattern are exposed on both the top and the bottom surface of panel 12. The bonding wires are attached to the portions of the pattern that are exposed on the top surface of the panel using conventional wire bonding processes. The portions of patterns 14 that are exposed on the bottom of panel 12 are used to electrically connect their associated integrated circuit die 16 to external electrical elements once the packages are separated from one another by sawing panel 12 into individual packages.

To protect the die and the arrays of bonding wires, a layer of encapsulating material 20 is applied and cured over the top of panel 12 as shown in FIG. 1D. In an optional additional step (not shown), arrays of solder balls may be attached to the exposed portions of each of the electrical connecting patterns 14 on the bottom surface of panel 12. These arrays of solder balls may be used to act as contacts for attaching the package to external electrical elements.

Once panel 12 has been coated with a layer of encapsulating material to protect the die and the bonding wires, packages 10 are singulated by sawing the panel into individual chip scale packages as indicated by dashed saw lines 22 in FIG. 1E. This step of singulating the packages also electrically isolates each of the packages by cutting any electrical traces of electrical connecting patterns 14 which interconnect adjacent patterns. Once the packages are singulated, they are ready to be electrically tested.

As described above, the electrical connecting patterns of the chip scale packages on the panel typically electrically interconnect with one another. This is one of the reasons the packages are singulated prior to their electrical testing. Because the chip scale packages are singulated prior to the individual electrical testing of each of the chip scale packages, the individual packages must be mounted or otherwise supported for testing. This is difficult because of the very small size of the packages and the desire to highly automate the testing process. Because of this difficulty in accurately supporting the singulated packages for testing, the packages cannot be easily tested in a reliable manner thereby slowing down and complicating the testing process. Also, because of the difficulty in handling the singulated packages for testing, the number of packages that fail the electrical testing process is potentially increased even though the packages may be good packages. These problems increase the overall cost of producing the chip scale packages. The present invention provides methods for producing and testing chip scale packages that eliminates the need to singulate the packages prior to testing thereby reducing the cost of producing and testing chip scale packages.

SUMMARY OF THE INVENTION

As will be described in more detail hereinafter, a methods for producing and electrically testing a chip scale integrated circuit package are herein disclosed. The methods include the step of providing a panel having a plurality of chip scale packages assembled on the panel. Each of the chip scale packages are electrically isolated from one another by cutting any electrically conductive paths which electrically interconnect the chip scale packages to one another on the panel. The step of electrically isolating the chip scale packages is done without singulating or physically separating the chip scale packages. The chip scale packages are then individually electrically tested while they remain physically connected to one another on the panel. After the chip scale packages are individually tested, the chip scale packages are singulated.

In one embodiment, the step of providing a panel having a plurality of chip scale packages includes the step of providing a substrate having a plurality of electrical connection patterns for electrically connecting an integrated circuit die to external electrical elements. The substrate has a top surface and a bottom surface. A plurality of integrated circuit die are attached to the top surface of the substrate. Each die is associated with a corresponding one of the electrical connection patterns. Bonding wires are formed to wire bond and electrically connect each of the die to their corresponding electrical connection patterns. The bonding wires and die are encapsulated by applying a layer of encapsulating material over the bonding wires, die, and top surface of the substrate thereby forming the panel including a plurality of chip scale packages.

In one version of the above described embodiment, the step of electrically isolating each of the chip scale packages includes the step of sawing grooves into the bottom surface of the substrate. The grooves extend substantially through the substrate but not through the layer of encapsulating material. This causes the chip scale packages to remain physically connected to one another by the layer of encapsulating material. The grooves also serve to cut any electrically conductive paths of the electrical connecting patterns which electrically interconnect the chip scale packages to one another on the panel.

BRIEF DESCRIPTION OF THE DRAWINGS

The features of the present invention may best be understood by reference to the following description of the presently preferred embodiments together with the accompanying drawings.

DETAILED DESCRIPTION OF THE PREFERRED EMBODIMENTS

An invention is herein described for providing methods for producing and testing chip scale packages. In the following description, numerous specific details are set forth in order to provide a thorough understanding of the present invention. However, in view of this description, it will be obvious to one skilled in the art that the present invention may be embodied in a wide variety of specific configurations. Also, well known integrated circuit package manufacturing processes such as die attaching processes, wire bonding processes, integrated circuit package encapsulating or molding processes, and other such conventional integrated circuit manufacturing processes will not be described in detail in order not to unnecessarily obscure the present invention.

Figure 1A:
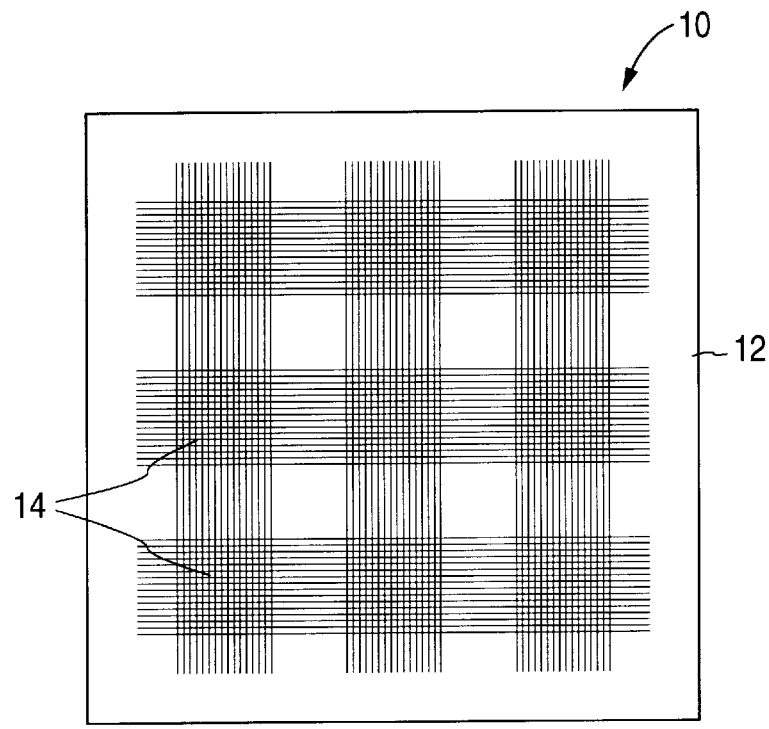
FIG. 1A is a diagrammatic plan view of a panel which is used to produce a plurality of prior art chip scale packages and which includes a plurality of electrical connecting patterns.
Figure 1B:
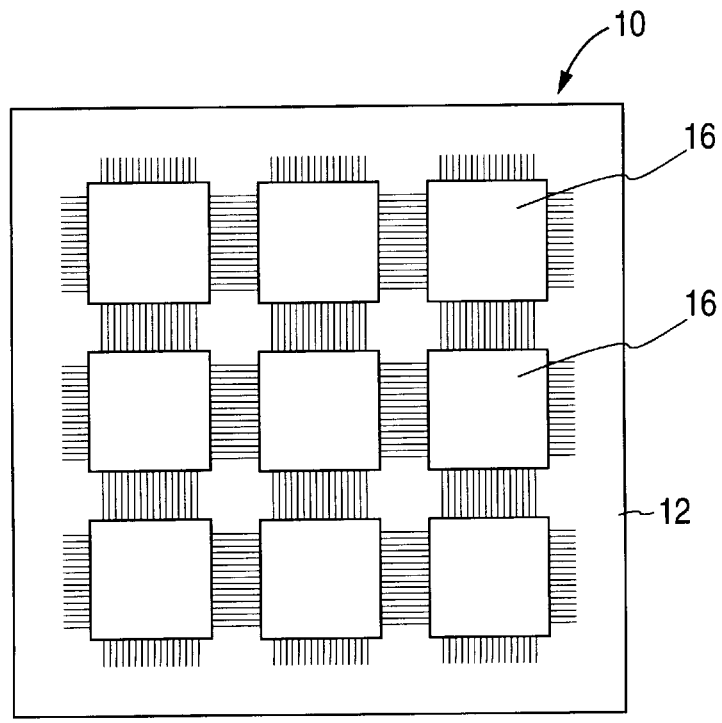
FIG. 1B is a diagrammatic plan view showing the panel of FIG. 1A after a plurality of integrated circuit die have been attached to the panel.
Figure 2A:
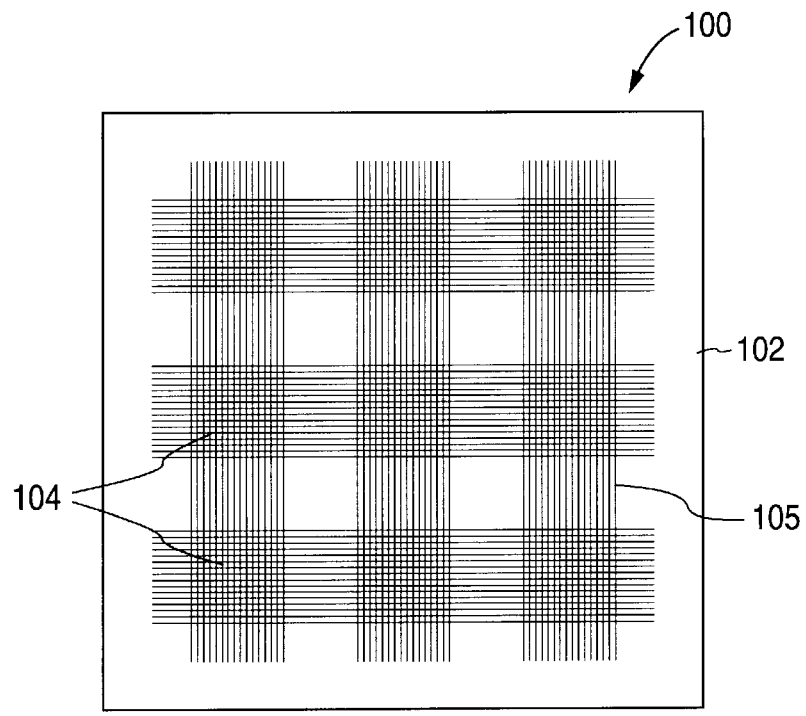
FIG. 2A is a diagrammatic plan view of a panel which is used to produce a plurality of chip scale packages in accordance with the present invention and which includes a plurality of electrical connecting patterns, each pattern being associated with one of the packages.

Referring initially to FIG. 2A, a plurality of chip scale integrated circuit packages 100 manufactured using one embodiment of a method in accordance with the invention will initially be described. As described above with reference to FIG. 1A, FIG. 2A illustrates an initial step in producing the plurality of chip scale packages 100 in which a panel 102 is provided. In this embodiment, panel 102 includes an array of electrical connecting patterns 104. Each of the electrical connecting patterns 104 is associated with one of the chip scale packages 100 being produced. Each of the electrical connecting patterns 104 includes a plurality of electrically conductive traces formed on and/or within panel 102. As was described above in the background, these electrical connecting patterns are used to electrically connect the integrated circuit packages to external electrical elements.

As shown in FIG. 2A, at least some of the electrical connecting patterns 104 are electrically connected to one another by traces 105 which extend between adjacent electrical connecting patterns. As will be described in more detail hereinafter, and in accordance with the present invention, these traces that interconnect adjacent patterns will be cut to electrically isolate each of the patterns from one another in a later process step.

Panel 102 and electrical connecting patterns 104 may take a wide variety of forms and still remain within the scope of the invention. Depending on the complexity of the integrated circuit package being produced, the electrical patterns may be very complex. For example, in a very complex integrated circuit package, panel 102 may be a multilayer panel with multiple layers of electrical connecting patterns associated with each of the layers of the panel. Also, any conventional materials and methods may be used to form panel 102 and patterns 104.

Although panel 102 is shown in FIG. 2A as having nine electrical connecting patterns formed on the panel, this is not a requirement. Instead, it should be understood that any desired number of patterns may be included depending upon how many packages are intended to be assembled on the panel.

Figure 2B:
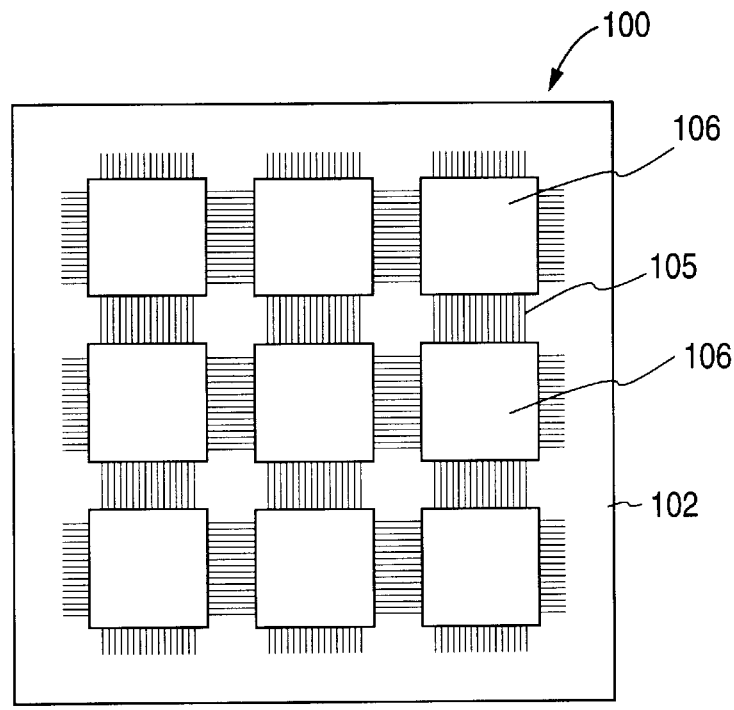
FIG. 2B is a diagrammatic plan view showing the panel of FIG. 2A after a plurality of integrated circuit die have been attached to the panel.

As illustrated in FIG. 2B, a plurality of integrated circuit die 106 are attached to the top surface of panel 102 using any suitable and conventional die attaching process. These die attach processes are known to those skilled in the art and therefore will not be further described. Each die 106 corresponds to an associated one of electrical connecting patterns 104 and is positioned above its associated electrical connecting pattern 104.

Figure 1C:
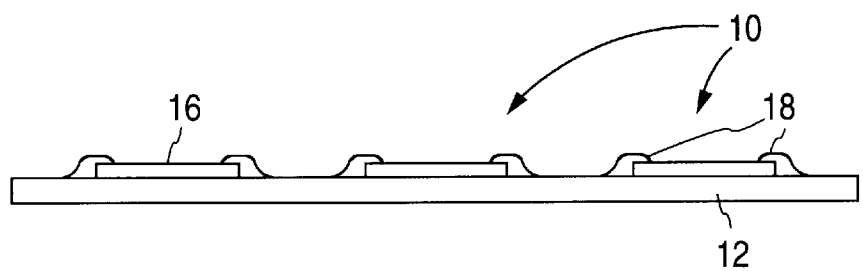
FIG. 1C is a diagrammatic cross-sectional view of the panel of FIG. 1B after the integrated circuit die have been wire bonded to the electrical connecting patterns on the panel.
Figure 1D:
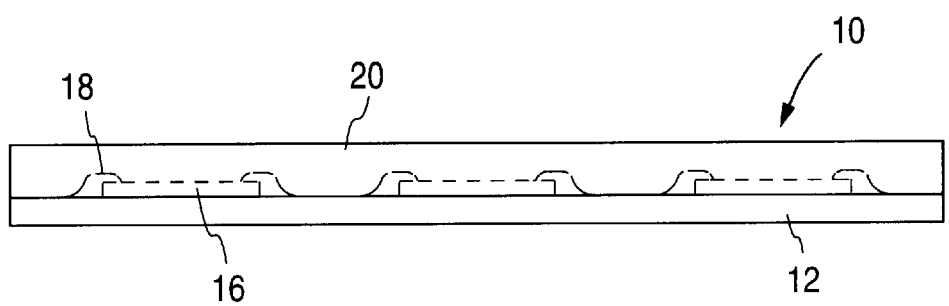
FIG. 1D is a diagrammatic cross-sectional view of the panel of FIG. 1C after a layer of encapsulating material has been applied over the integrated circuit die and bonding wires.
Figure 2C:
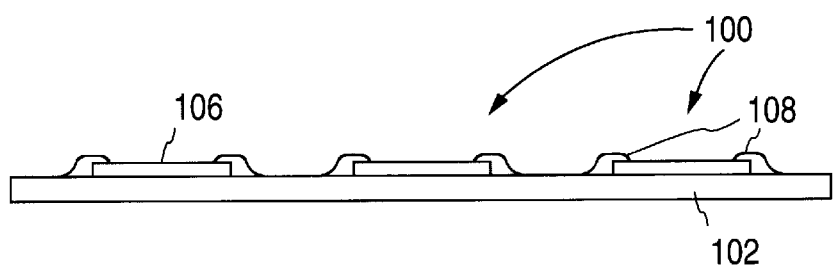
FIG. 2C is a diagrammatic cross-sectional view of the panel of FIG. 2B after the integrated circuit die have been wire bonded to the electrical connecting patterns on the panel.

Next, as shown in FIG. 2C and in the same manner as described above for FIG. 1C, an array of bonding wires 108 is formed to electrically connect each die 106 to its associated electrical connecting pattern 104 (not shown in FIG. 2C). Typically, electrical connecting patterns 104 extend through panel 102 such that portions of the pattern are exposed on both the top and the bottom surface of panel 102. Bonding wires 108 are attached to the portions of the electrical connecting patterns 104 that are exposed on the top surface of the panel using conventional wire bonding processes. The portions of patterns 104 that are exposed on the bottom of panel 102 are used to electrically connect their associated integrated circuit die 106 to external electrical elements once the packages are separated from one another by sawing panel 102 into individual packages.

Although integrated circuit die 106 have been described above as being electrically connected to electrical connecting patterns 104 using arrays of bonding wires 108, this is not a requirement of the invention. Instead, other conventional methods of electrically connecting die to electrical connecting patterns such as flip chip methods may alternately be used.

Figure 2D:
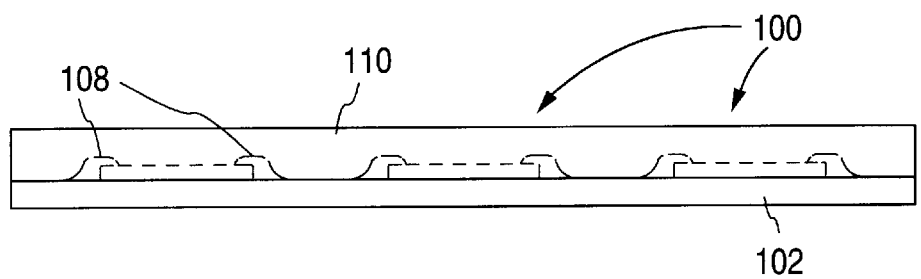
FIG. 2D is a diagrammatic cross-sectional view of the panel of FIG. 2C after a layer of encapsulating material has been applied over the integrated circuit die and bonding wires.

Referring to FIG. 2D, a layer of encapsulating material 110 is applied and cured over the top of panel 102. Encapsulating material 110 may be any conventional encapsulating material and may be applied in any convention manner. As mentioned above in the background, arrays of solder balls may be attached to the exposed portions of each of the electrical connecting patterns 104 on the bottom surface of panel 102 in a optional additional step (not shown in the figures). These arrays of solder balls would act as contacts for attaching the package to external electrical elements. This process of attaching solder balls is a conventional process known to those skilled in the art.

Figure 1E:
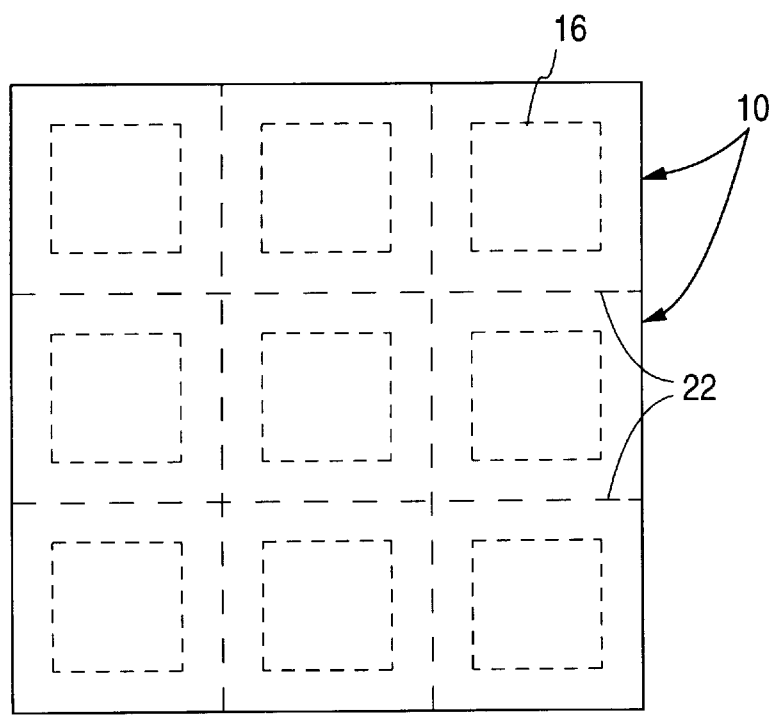
FIG. 1E is a diagrammatic plan view of the panel of FIG. 1D showing the lines along which the panel is sawed in order to singulate the assembled chip scale packages.
Figure 2E:
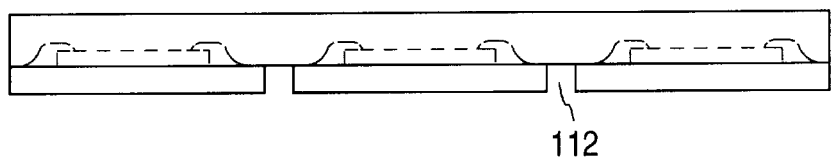
FIG. 2E is a diagrammatic cross-sectional view of the panel of FIG. 2D showing the lines along which the panel is partially sawed in order to electrically isolate the assembled chip scale packages in accordance with the present invention.

At this point, using the conventional methods of producing chip scale packages that were described in the background, packages 100 would typically be singulated by sawing the panel into individual chip scale packages as described above with reference to FIG. 1E. This singulating of the packages leads to the testing problems described above. However, in accordance with the present invention, packages 100 are not singulated from one another prior to testing. Instead, as illustrated in FIG. 2E, panel 102 is cut only enough to electrically isolate the different electrical connecting patterns 104, and therefore the different packages 100, from one another without physically separating each of the packages. In this embodiment, the packages are electrically isolated from one another by sawing grooves 112 into the bottom of the assembly, thereby cutting any traces 105 that interconnect the different packages.

Figure 2F:
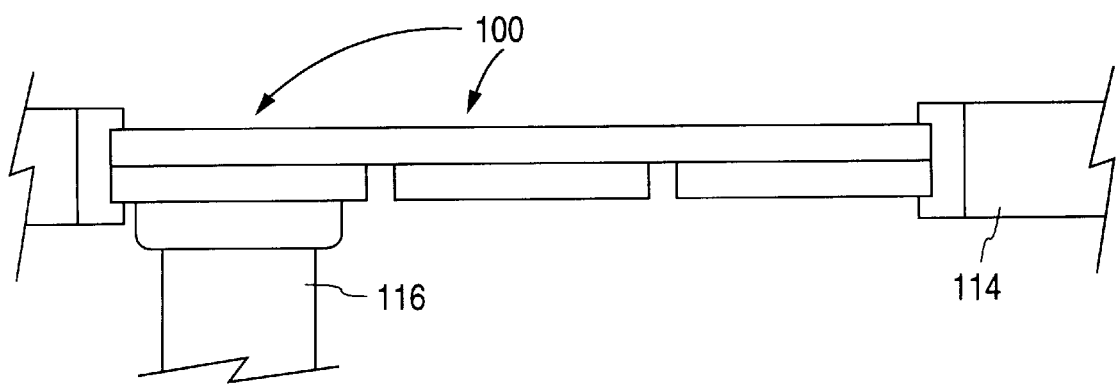
FIG. 2F is a diagrammatic cross-sectional view of the panel of FIG. 2E showing how the panel is supported so that the electrically isolated packages may be individually tested.

By leaving the packages 100 physically connected to one another, the entire panel including all of the packages 100 may be supported as a single unit for the testing of the packages as illustrated in FIG. 2F. As shown in FIG. 2F, the panel of assembled packages is supported by a support mechanism 114. This allows all of the packages assembled on the panel to be easily and accurately tested using a test head 116. This approach substantially simplifies the testing procedure by eliminating the problems associated with the handling of and proper registering of the singulated packages as described above in the background. Also, since the entire panel is being supported for the testing, the handling equipment used during the testing process can be the same as the handling equipment used during the assembly of the packages. This eliminates the need for specially configured handling equipment to handle the singulated packages for testing.

In the embodiment shown in FIG. 2E, the individual packages 100 are electrically isolated from one another by sawing grooves 112 partially through panel 102 but not sawing through the layer of encapsulating material 110. Cutting entirely through the substrate of panel 102 up to the layer of encapsulating material 110 ensures that any and all of the electrical connections between different packages 100 are cut. However, by not cutting through the encapsulating material, the packages remain physically connected to one another. This embodiment has the additional advantage of relieving any internal stresses that may have built up in panel 102 during the assembly of the packages.

Although the embodiment shown in FIG. 2E illustrates cutting grooves 112 entirely through the panel 102 and leaving only the encapsulating material in tact, this is not a requirement. Instead, the overall assembly may be partially cut in any desired manner and still remain within the scope of the invention so long as any electrical connections between different packages are cut and the packages remain physically connected to one another. For example, in a case where the only electrical connections between different packages are located on the bottom surface of the panel, these connections may be cut without cutting substantially into the panel itself or into the encapsulating material layer.

Although only one specific embodiment of the methods in accordance with the invention have been described above in detail, it is to be understood that the methods of the present invention may be embodied in a wide variety of alternative forms and still remain within the scope of the invention. Any of these various embodiments would equally fall within the scope of the invention so long as any electrically conductive traces that electrically interconnect the chip scale packages on a panel are cut, thereby electrically isolating the packages without physically separating the individual packages. For example, although packages on the panel of the embodiment described were electrically isolated by sawing partially through the panel, it is to be understood that the invention is not limited to this specific method of electrically isolating the packages. Instead, the invention would equally apply to any method which electrically isolates the packages without physically separating the packages. Also, although only one specific configuration of a chip scale package has been described, it is to be understood that the present invention would equally apply to any packages which are produced by assembling a plurality of packages on a panel.

Also, although the chip scale packages have been described with its various components having particular respective orientations, it should be understood that the present invention may take on a wide variety of specific configurations with the various components being located in a wide variety of positions and mutual orientations and still remain within the scope of the present invention. Therefore, the present examples are to be considered as illustrative and not restrictive, and the invention is not to be limited to the details given herein, but may be modified within the scope of the appended claims.

What is claimed is:

1. A method of testing chip scale integrated circuit packages, the method comprising the steps of:
    a) providing a panel including a plurality of chip scale packages assembled on the panel;
    b) electrically isolating each of the chip scale packages from one another by cutting any electrically conductive paths which electrically interconnect the chip scale packages to one another on the panel without singulating the chip scale packages; and
    c) individually electrically testing the chip scale packages while they remain physically connected to one another on the panel.

2. A method according to claim 1 wherein the step of providing a panel including a plurality of chip scale packages includes the steps of:
    a) providing a substrate including a plurality of electrical connection patterns for electrically connecting an integrated circuit die to external electrical elements, the substrate having a top surface and a bottom surface;
    b) attaching a plurality of integrated circuit die to the top surface of the substrate, each die being associated with a corresponding one of the electrical connection patterns;

c) forming bonding wires to wire bond and electrically connect each of the die to their corresponding electrical connection patterns; and d) encapsulating the bonding wires and die by applying a layer of encapsulating material over the bonding wires, die, and top surface of the substrate thereby forming the panel including a plurality of chip scale packages.

3. A method according to claim 2 wherein the step of electrically isolating each of the chip scale packages includes the step of sawing grooves into the bottom surface of the substrate, the grooves extending substantially through the substrate but not through the layer of encapsulating material thereby causing the chip scale packages to remain physically connected to one another by the layer of encapsulating material, the grooves also serving to cut any electrically conductive paths of the electrical connecting patterns which electrically interconnect the chip scale packages to one another on the panel.

4. A method of producing chip scale integrated circuit packages, the method comprising the steps of:

a) providing a panel including a plurality of chip scale packages assembled on the panel;

b) electrically isolating each of the chip scale packages from one another by cutting any electrically conductive paths which electrically interconnect the chip scale packages to one another on the panel without singulating the chip scale packages;

c) individually electrically testing the chip scale packages while they remain physically connected to one another on the panel; and d) after individually testing the chip scale packages, singulating the chip scale packages.

5. A method according to claim 4 wherein the step of providing a panel including a plurality of chip scale packages includes the steps of:

a) providing a substrate including a plurality of electrical connection patterns for electrically connecting an integrated circuit die to external electrical elements, the substrate having a top surface and a bottom surface;

b) attaching a plurality of integrated circuit die to the top surface of the substrate, each die being associated with a corresponding one of the electrical connection patterns;

c) forming bonding wires to wire bond and electrically connect each of the die to their corresponding electrical connection patterns; and d) encapsulating the bonding wires and die by applying a layer of encapsulating material over the bonding wires, die, and top surface of the substrate thereby forming the panel including a plurality of chip scale packages.

6. A method according to claim 5 wherein the step of electrically isolating each of the chip scale packages includes the step of sawing grooves into the bottom surface of the substrate, the grooves extending substantially through the substrate but not through the layer of encapsulating material thereby causing the chip scale packages to remain physically connected to one another by the layer of encapsulating material, the grooves also serving to cut any electrically conductive paths of the electrical connecting patterns which electrically interconnect the chip scale packages to one another on the panel.

* * * * *